US006696371B2

(12) United States Patent
Butschke et al.

(10) Patent No.: US 6,696,371 B2
(45) Date of Patent: Feb. 24, 2004

(54) METHOD FOR FABRICATING POSITIONALLY EXACT SURFACE-WIDE MEMBRANE MASKS

(75) Inventors: Joerg Butschke, Stuttgart (DE); Albrecht Ehrmann, Krailling (DE); Ernst Haugeneder, Vienna (AT); Florian Letzkus, Tuebingen (DE); Reinhard Springer, Sulz (DE)

(73) Assignees: Infineon Technologies AG, Munich (DE); IMS-Ionen Mikrofabrikations Systeme Ges. mbH, Vienna (AT)

( * ) Notice: Subject to any disclaimer, the term of this patent is extended or adjusted under 35 U.S.C. 154(b) by 0 days.

(21) Appl. No.: 10/163,007

(22) Filed: Jun. 5, 2002

(65) Prior Publication Data

US 2002/0182895 A1 Dec. 5, 2002

(30) Foreign Application Priority Data

Jun. 5, 2001 (DE) ......................... 101 27 217

(51) Int. Cl.⁷ .................. H01L 21/302; H01L 31/0232
(52) U.S. Cl. .................................................. 438/942
(58) Field of Search .......................... 438/455, 501, 438/942

(56) References Cited

U.S. PATENT DOCUMENTS 5,110,373 A * 5/1992 Mauger ................. 148/33.2
6,156,217 A 12/2000 Hammel et al.
6,297,169 B1 * 10/2001 Mangat et al. ............. 438/736
6,368,942 B1 * 4/2002 Cardinale ................. 438/459
6,465,327 B1 * 10/2002 Aspar ....................... 438/458

FOREIGN PATENT DOCUMENTS

WO     WO 99/49365     9/1999

OTHER PUBLICATIONS

Translation of submitted foreign document (WO 99/49365).*

* cited by examiner

Primary Examiner—Carl Whitehead, Jr.
Assistant Examiner—David S Blum
(74) Attorney, Agent, or Firm—Laurence A. Greenberg; Werner H. Stemer; Gregory L. Mayback

(57) ABSTRACT

The membrane mask is based on an SOI substrate. In an existing or subsequently produced multilayer semiconductor/insulator/semiconductor-carrier-layer substrate, the inhomogeneous mechanical stresses in the semiconductor layer, which lead to undesirable distortions, are converted at least partly into a homogenous state prior to the structuring of the semiconductor layer. In order to accomplish this, either an additional layer structure is provided on an existing SOI substrate, or a modified layer structure is provided in the fabrication of the SOI substrate, or both.

11 Claims, 2 Drawing Sheets

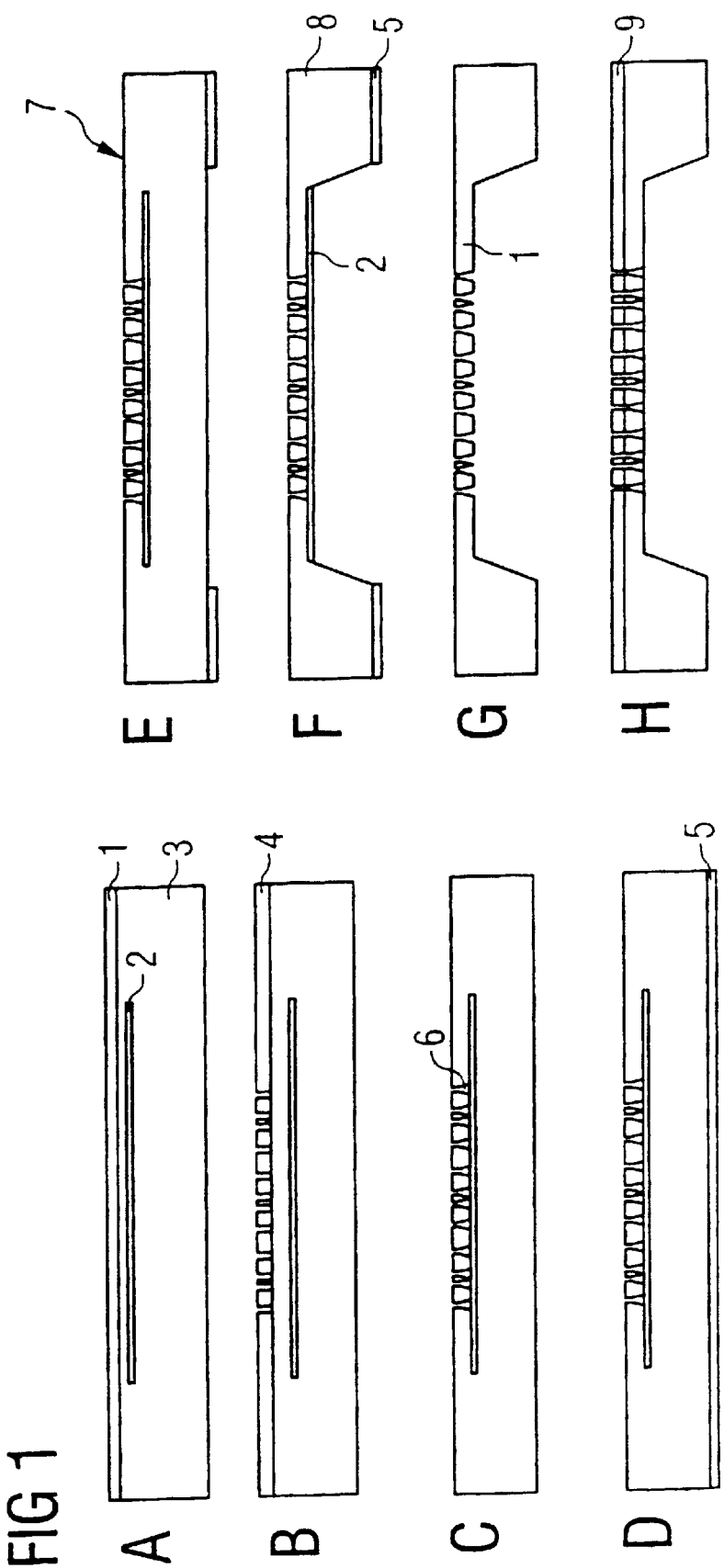

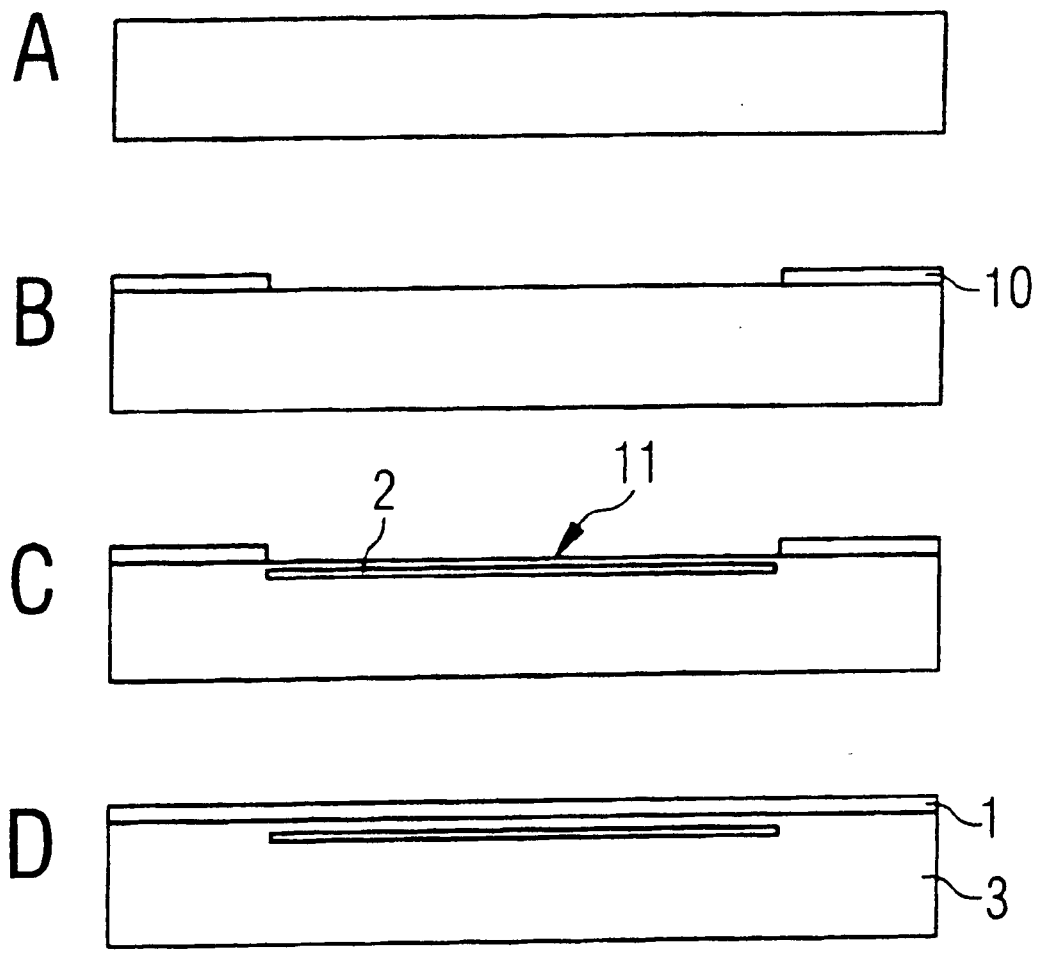

METHOD FOR FABRICATING POSITIONALLY EXACT SURFACE-WIDE MEMBRANE MASKS

BACKGROUND OF THE INVENTION

Field of the Invention

The invention relates to a method for fabricating a surface-wide membrane mask on the basis of an existing or subsequently fabricated multi-layer semiconductor/insulator/semiconductor-carrier-layer substrate (SOI substrate), whereby the semiconductor layer is structured by the formation of mask openings, and the semiconductor layer and insulator layer are eroded at least in the region beneath the mask openings, so that there emerges a membrane which is formed by the structured semiconductor layer and held by a bearing ring.

In current semiconductor technology, the structuring of the silicon wafer is carried out almost entirely by lithography, with a resist pattern first being generated on the wafer in a radiation-sensitive resist layer, which pattern then serves as the mask in a subsequent processing step, i.e. an etching step. The resist mask is then removed. The resist pattern itself is likewise produced with the aid of a mask that is suitable for the respective exposure technique. In conventional photolithography, chrome masks (reticles) are employed for this, which consist of a glass plate as the carrier and a thin structured chrome layer. Masks for X-ray lithography only allow mask carrier thicknesses in the micrometer range, even when weakly absorbent materials such as silicon are utilized. This is realized by membrane masks, which consist of a central active region wherein they are thinned to the membrane and a support margin (support ring) in the original thickness of the silicon substrate. In X-ray masks, a geometrically structured absorber layer is deposited on the membrane layer.

Electron and ion lithography require membrane masks wherein the mask openings are generated not on the membrane layer but in it. The membrane layer, whose thickness is in the micrometer range, contains mask openings or holes corresponding to the figures that are to be lithographically generated. These shadow masks (stencil masks), as they are called, are mechanically relatively unstable formations, as are all membrane masks.

For electron and ion projection lithography as well as newer versions of X-ray lithography, membrane masks must be produced with thicknesses in the micrometer range and with membrane areas of up to more than 100 sq. centimeters. The membrane mask s generated by the inventive method can generally be applied in lithography procedures with charged particles and photons. An example is their application in 13 nm lithography (so-called soft X-raying). They can also be applied for masking with respect to neutral particles (atom lithography) and in all applications with an evaporation mask. Membrane masks as products of the inventive method can also be generally used for sensors.

Presuming silicon disks as the substrate material, two different technological processing variants are followed for fabricating the membrane masks. They differ principally as to whether the processing steps for mask structuring occur before (wafer flow process) or after (membrane flow process) the membrane fabrication.

In the wafer flow process as it is represented in published international PCT application WO 99/49365, the mask structures are first generated on a compact silicon wafer, and the membrane fabrication by back-etching the substrate takes place at the end of the process. On the one hand, that variant makes it possible to execute the structuring process for the mask structure on stable, more manageable wafers. On the other hand, that variant also makes very high demands on the membrane etching process, because the structured membrane side must be protected from an etch attack with absolute certainty. A boron doping of the membrane layer has been customarily provided as the etch stop technique, which often does not produce sufficiently precisely defined relations. Besides this, (homogenous) mechanical tensions in the membrane layer emerge owing to the boron doping, which can be entirely or partly compensated by an additional germanium doping. Recently, SOI (silicon on insulator) substrates have also been utilized for this reason, which are likewise described in WO 99/49365. The buried oxide layer in the SOI wafer serves as a defined etch stop, and the doping of the membrane layer can be selected arbitrarily according to other factors.

For the position of the structures that are incorporated in the membrane which are decisive for the function of the mask, a positional precision of a few nanometers is required. Even small inhomogeneities in the starting material can make it impossible to achieve this object. The underlying problem of the invention will be described below in reference to the SOI wafer flow process.

Presuming a semiconductor/insulator/semiconductor-carrier-layer substrate, the future structure of the membrane is transferred into the top semiconductor layer, i.e. the future membrane layer. In a further step, the semiconductor carrier layer is removed from the bottom side to an outer ring. Lastly, the exposed insulator layer is also removed in the center region, so that the exposed center region, which is stretched by the support ring, of the semiconductor layer lying thereon represents the structured membrane. Depending on the (homogenous) internal stress of the membrane layer, more or less intensive shifting of the mask structures occurs relative to the original position. Superimposed on this is yet another shift, which is attributable to mechanical irregularities in the semiconductor layer. While the former can be compensated if the stress is known by a predistortion of the data in the structure transfer, no such corrective possibilities exist for the latter.

The inhomogeneous stresses, which, in the extreme case, can already exert a distorting effect in the transfer of the structures into the membrane layer, arise particularly in connection with SOI substrates, for various reasons having to do with their structure or the fabrication process. For instance, the fabrication of buried oxide layers by means of wafer bonding is practically inevitably accompanied by mechanical irregularities expressing themselves in inhomogeneous stresses in the top semiconductor layer, which is often only fractions of a micrometer thick.

SUMMARY OF THE INVENTION

It is accordingly an object of the invention to provide a method of fabricating positionally exact, large area membrane masks, which overcomes the above-mentioned disadvantages of the heretofore-known devices and methods of this general type and which allows the fabrication of positionally exact membrane masks even when SOI substrates are utilized.

With the foregoing and other objects in view there is provided, in accordance with the invention, a method of producing a surface-wide membrane mask, which comprises:

providing an SOI substrate formed of a semiconductor layer, an insulator, and a semiconductor carrier layer;

at least partially converting inhomogeneous mechanical stresses in the semiconductor layer into a homogenous state, to thereby either provide an additional layer structure on an existing SOI substrate, or a modified layer structure in the fabrication of the SOI substrate, or both;

subsequently structuring the semiconductor layer by forming therein mask openings; and removing the semiconductor carrier layer and the insulator layer in a region underneath the mask openings, to form a membrane structure having the structured semiconductor layer held by a support ring.

In other words, the invention may be defined as an improvement in a method of producing a surface-wide membrane mask based on an existing or yet to be produced multilayer substrate having a semiconductor layer, an insulator, and a semiconductor-carrier-layer, wherein the semiconductor layer is structured by forming mask openings therein, and the semiconductor carrier layer and the insulator layer are removed in a region s beneath the mask openings, to thereby form a membrane with the structured semiconductor layer held by a support ring. The improvement comprises:

at least partially converting inhomogeneous mechanical stresses in the semiconductor layer into a homogenous state prior to the structuring of the semiconductor layer, to thereby form either one or both of an additional layer structure on an existing SOI substrate, and a modified layer structure in the fabrication of the SOI substrate.

That is, the objects are inventively achieved in a method of the above type in that the inhomogeneous mechanical stresses in the semiconductor layer are at least partly converted into a homogenous state prior to its structuring, whereby either an additional layer structure is provided on an existing SOI substrate, or a modified layer structure is provided in the fabrication of the SOI substrate, or both.

The disadvantageous distortions can be minimized by the inventively provided homogenization of mechanical irregularities (stresses) in the membrane layer and the free adjustability of the stress condition in general which this makes possible.

For homogenization, it is generally advantageous when the semiconductor layer is composed of an existing start layer of the SOI substrate and an additional reinforcing layer which is epitaxially grown onto the start layer, whereby the thickness of the reinforcing layer is selected such that the characteristics of the semiconductor layer as a whole with respect to the inhomogeneous stresses are predominantly determined by the reinforcing layer. With this method, a finished SOI substrate which is already provided as a basis for the membrane production can still be modified in the direction of the desired homogeneity, and the method is particularly suitable for rather thin start layers up to approx. 1 µm.

A particularly advantageous development of this method provides that in the SOI substrate fabrication process, the insulator layer is recessed in the region of the support ring which remains when the membrane is later etched. This is based on the recognition that a substantial cause of the stress problems of the membrane is that the insulator layer itself likewise exhibits strong stresses. An insulator layer which remains in the region of the support ring, as has been common, thus exerts an adverse effect on the stress condition.

This can be advantageously accomplished simply by executing the mask for defining the insulator layer and the mask for defining the membrane in alignment with one another.

Another expedient possibility is to utilize an SOI substrate with a buried insulator layer that is generated by ion implantation in order to produce the locally limited insulator layer, because it would require appreciably more outlay to shadow the regions that should not be provided with the insulator layer particularly in connection with fabricating the SOI substrate in the wafer bonding method.

When the inventive method is a wafer flow process, it is also advantageous that layers serving for membrane definition are only deposited on the bottom side of the SOI substrate following the structuring of the semiconductor layer, because otherwise undesirable stress effects would emerge from these layers also.

Other advantageous developments and features of the invention, particularly with respect to the adjustability of the stress condition in general, are set forth in the appended claims.

Although the invention is illustrated and described herein as embodied in a method for fabricating positionally exact surface-wide membrane masks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 illustrates successive substeps A to H (1A–1H) of an inventive method given utilization of a modified SOI substrate; and FIG. 2 illustrates successive substeps A to D (2A–2D) for fabricating the SOI substrate utilized in the method according to FIG. 1.

DESCRIPTION OF THE PREFERRED EMBODIMENTS

Referring now to the figures of the drawing in detail and first, particularly, to FIG. 1 thereof, the starting point in FIG. 1A is an SOI substrate with a semiconductor carrier layer 3, a reinforced semiconductor layer 1, and an interposed buried insulator layer 2 which does not extend over the entire wafer cross-section as in conventional SOI substrates.

In the next substep 1B, a resist layer 4, wherein the hole pattern which is recognizable in the figure has been generated by electron lithography, is deposited on the top of the SOI substrate.

In the next substep 1C, the (trench) etching of the mask openings 6 in the semiconductor layer 1 and the removal of the resist layer 4 are carried out.

In a further substep 1D, a mask layer 5 is deposited onto the back side of the SOI substrate for the bottom processes.

In the next processing step 1E, the masking layer 5 is opened to at least a given size, which corresponds to the side of the insulator layer 2 that is buried in the center of the substrate. The opening of the window in the rearward masking layer 5 defines the size of the future membrane. In addition, a protective layer 7 is applied onto the already structured front side of the substrate.

In the next substep 1F, the removal of the semiconductor carrier layer 3 proceeds from the back side in an etching process, as generally known, whereby the insulator layer 2, having good selectivity, serves as an etch stop.

This is followed by the removal of the protective layer 7, the residue of the mask layer 5 which remains on the bottom of the support ring 8, and the insulator layer 2 in the next substep 1G. The semiconductor layer 1, which is supported by the support ring 8, now forms the structured membrane. According to the invention, none of the insulator layer 2 remains on the edge of the SOI substrate; rather, it is completely removed, which contributes appreciably to the homogenization of the stresses in the membrane layer.

In the next processing step 1H, a carbon layer 9 can be additionally deposited on the front of the substrate and provided with holes corresponding to the mask openings by means of etching. The carbon layer 9 constitutes a guard for the silicon substrate during irradiation with ion beams, whereas it is not needed for electron beams.

In FIG. 2 the starting point 2A for fabricating an SOI substrate by ion implantation is a silicon wafer. In substep 2B its front side is provided with a mask 10 for the subsequent oxygen implantation.

According to processing step 2C, a buried oxide layer 2 is subsequently generated in the center region of the wafer by oxygen implantation, as generally known. Over the oxide layer 2 is the monocrystalline silicon layer that will be utilized hereinafter as start layer 11, which is less than one micrometer thick. The crystal flaws in the silicon lattice which emerge with the deceleration of the oxygen ions can be re-annealed by a tempering process at high temperature following the implantation.

In processing step 2D, an epitaxial reinforcing layer is deposited onto the thin silicon start layer 11 following the removal of the implantation mask 10. This is accomplished, as generally known, by the monocrystalline (i.e. stress-free) growing of a silicon reinforcing layer on the monocrystalline substrate, which can be carried out by CVD deposition of silicon at a temperature above 800° C. This produces a semiconductor layer 1 with a thickness on the order of between 1 and 3 $\mu$m, which is advantageous for the handling of membrane masks. On the other hand, the characteristics of the reinforcing layer, which is much larger than the start layer 11 and which is generated with controllable parameters, determine the mechanical characteristics of the resulting overall semiconductor layer 1. By combining a local, fully removable insulator layer as represented in FIG. 1 with the reinforced semiconductor layer 1, it is possible to reduce the reinforcing layer thickness that is required for stress homogenization. But the invention can be realized just as well in a development with only a reinforcing layer or a local insulator layer 2.

The (homogenous) mechanical tension of the membrane can be set by incorporating foreign atoms (impurities). Because a definite membrane conductivity is often desired in addition to a definite internal stress, the independent setting of both parameters represents a substantial advantage. For example, by incorporating electrically inactive impurities, high-tension membranes with low conductivity can be produced.

We claim:

1. A method of producing a surface-wide membrane mask, which comprises:
   providing an SOI substrate formed of a semiconductor layer, an insulator, and a semiconductor carrier layer;
   at least partially converting inhomogeneous mechanical stresses in the semiconductor layer into a homogenous state by one of:
      providing an additional layer structure on said existing SOI substrate,
      providing a modified layer structure in a fabrication of said SOI substrate, and
      providing both of said layer structures;
   subsequently structuring the semiconductor layer by forming therein mask openings; and
   removing the semiconductor carrier layer and the insulator layer in a region underneath the mask openings, to form a membrane structure having the structured semiconductor layer held by a support ring.

2. The method according to claim 1, which comprises constructing the semiconductor layer from an existing start layer of the SOI substrate and epitaxially growing an additional reinforcing layer on the start layer, and thereby selecting a thickness of the reinforcing layer so that a characteristic of the semiconductor layer as a whole with respect to the inhomogeneous stresses is determined predominantly by the reinforcing layer.

3. The method according to claim 1, which comprises, in the fabrication of the SOI substrate, recessing the insulator layer in a region of the support ring that is to remain behind when the membrane is later etched.

4. The method according to claim 2, which comprises aligning the mask for defining the insulator layer and the mask for defining the membrane.

5. The method according to claim 3, which comprises providing the SOI substrate with a buried insulator layer generated by ion implantation and limited to a region of the subsequent membrane.

6. The method according to claim 1, which comprises processing with a wafer flow process, and depositing layers serving for membrane definition onto a bottom of the SOI substrate only after the step of structuring the semiconductor layer.

7. The method according to claim 1, which comprises independently setting an optimal homogenous mechanical stress of the membrane by way of doping the semiconductor layer.

8. The method according to claim 7, which comprises independently setting the mechanical stress and a conductivity of the membrane by at least one of selecting a base conductivity and incorporating impurities.

9. In a method of producing a surface-wide membrane mask based on a multilayer substrate having a semiconductor layer, an insulator, and a semiconductor-carrier-layer, wherein the semiconductor layer is structured by forming mask openings therein, and the semiconductor carrier layer and the insulator layer are removed in a region beneath the mask openings, to thereby form a membrane with the structured semiconductor layer held by a support ring, the improvement which comprises:
   at least partially converting inhomogeneous mechanical stresses in the semiconductor layer into a homogenous state prior to the structuring of the semiconductor layer, by one of:
      providing an additional layer structure on an existing SOI substrate,
      providing a modified layer structure in a fabrication of a modified SOI substrate, and
      providing both of said layer structures.

10. The method according to claim 9, which comprises depositing at least one additional layer on an existing SOI substrate.

11. The method according to claim 9, which comprises modifying the layer structure of the semiconductor.

* * * * *